United States Patent
Liaw

[11] Patent Number: 6,121,684
[45] Date of Patent: Sep. 19, 2000

[54] INTEGRATED BUTT CONTACT HAVING A PROTECTIVE SPACER

[75] Inventor: Jhon-Jhy Liaw, Taipei, Taiwan

[73] Assignee: Taiwan Semiconductor Manufacturing Company, Hsin-Chu, Taiwan

[21] Appl. No.: 09/359,885

[22] Filed: Jul. 26, 1999

Related U.S. Application Data

[62] Division of application No. 08/901,632, Jul. 28, 1997.

[51] Int. Cl.[7] .......................... H01L 23/48; H01L 23/52; H01L 29/40
[52] U.S. Cl. ........................... 257/758; 257/750; 257/752
[58] Field of Search ................................... 257/758, 750, 257/773, 776, 752, 622; 438/296, 238, 297, 305

[56] References Cited

U.S. PATENT DOCUMENTS

| | | | |
|---|---|---|---|
| 5,677,231 | 10/1997 | Maniar et al. | 437/67 |
| 5,763,315 | 6/1998 | Benedict et al. | 438/424 |
| 6,046,505 | 4/2000 | Howard | 257/776 |

OTHER PUBLICATIONS

Wolf et al., Silicon Processing for the VLSI Era, vol. 2, pp. 160–163.

*Primary Examiner*—Tom Thomas
*Assistant Examiner*—Douglas W. Owens
*Attorney, Agent, or Firm*—George O. Saile; Stephen B. Ackerman; William J. Steffel

[57] ABSTRACT

The present invention provides a structure and method of forming a butting contact having protective spacers 50A that prevent shorting between a second polysilicon layer 60 and the substrate in a hole 20A in a isolation region 20. The following are provide: a isolation region 20, a first conductive line 30B over portions of the isolation region 20, and an inter-poly insulating layer 40. The protective spacers prevent shorts when the first conductive line 30B is misaligned and exposes a first portion of the isolation region 20 in a butt contact opening. A first photoresist layer 44 having a butt contact photoresist opening 44A over the first doped region 26 and over a first portion of the isolation is formed. The inter-poly insulating layer 40 is etched through the butt contact photoresist opening 44A and etches the first portion of the isolation region forming an isolation hole 20A. In an important step, protective spacers 50A are formed on the sidewalls of the isolation hole 20A. A second conductive layer 60 is formed over an inter-poly insulating layer 40, in the butt contact opening, and over the protective spacers 50A. The protective spacers 50A prevent the second conductive layer 60 from contacting the substrate in the hole 20A.

5 Claims, 7 Drawing Sheets

INTEGRATED BUTT CONTACT HAVING A PROTECTIVE SPACER

This is a division of patent application Ser. No. 08/901,632, filing date Jul. 28, 1997, Integrated Butt Contact Having A Protective Spacer, assigned to the same assignee as the present invention.

BACKGROUND OF INVENTION

1) Field of the Invention

This invention relates generally to a structure and fabrication of a semiconductor memory device and more particularly Lo the structure and fabrication of a butting contact structure between conductive layers and the substrate in a semiconductor device having a shallow trench isolation (STI)

2) Description of the Prior Art

There is a trend in the semiconductor industry toward fabricating larger and more complex functions on a given semiconductor chip. The larger and more complex functions are achieved by reducing device sizes and spacing and by reducing the junction depth of regions formed in the semiconductor substrate. Among the feature sizes which are reduced in size are the width and spacing of interconnecting metal lines and the contact openings through which the metallization makes electrical contact to device regions. As the feature sizes are reduced, new problems arise which must be solved in order to economically and reliably produce the semiconductor devices.

As the contact size and junction depth are reduced, a new device contact process is required to overcome the problems which are encountered.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,330,929 (Pfiester et al.) which shows a method of making a 6 T U.S. Pat. No. 5,1451,534 (Yang) shows a method of making a single layer TPT 6T SRAM. U.S. Pat. No. 5,394,358 (Huang) shows a method of forming a 6T SRAM that reduces the number of local interconnections. In addition, Wolf, "Silicon Processing For The VISI Era: Vol. 2", on pp. 160 to 161, discusses butted Contacts and Buried contacts.

However, there is still a need for an improved butting contact structure.

SUMMARY OF THE INVENTION

It is an object of the present invention to provide a method for fabricating a butting contact that prevents an overlying conductive layer from shorting to the substrate because of a poly-1 or butt contact to active region photo mis-alignment.

It is an object of the present invention to provide a method for fabricating a butting contact that prevents a second conductive layer (poly-2) 60 from shorting to the substrate when the first polysilicon layer 30B is mis-aligned with respect to the shallow trench isolation (STI) region.

It is yet another object of the present invention to provide a method for fabricating a butting contact that prevents a second conductive layer (poly-2) from shorting to the substrate when the butt contact opening is misaligned.

It is another object of the present invention to provide a method for fabricating a butting contact that widens the design rules (e.g. extend rules for the active region to Butt-contact or active region to the first conductive layer).

To accomplish the above objectives, the present invention provides a method of fabricating a Butt Contact 64 having protective spacers 50A to protect against shorting if misalignments occur. The method describe below describes what happens when the photo processes are mis-aligned. The invention works equally well when there are no misalignments. The misalignments are described so that the benefits of the protective spacers 50A of the invention will be clear. The method comprises the following steps:

a) See FIG. 1—forming a shallow trench isolation region 20 in a substrate 10; said shallow trench Isolation region 20 defining an active area 14 in said substrate 10;

b) forming gate structure 30A including at least a first conductive layer 30A over portions of said active area 14 and forming a first conductive line 30B over portions of the shallow trench isolation region 20 and the active region 14; the first conductive line 30B misaligned and exposing portions of the shallow trench isolation region 20;

c) forming first and second doped regions 26, 24 adjacent to the gate structure in the active areas; the first doped region 26 between the gate structure 30A and the shallow trench isolation region 20;

d) forming an inter-poly insulating layer 40 over the gate structure 30A and the first conductive line 30B e) See FIG. 1—forming a first photoresist layer 44 having a butt contact photoresist opening 44A through the first photoresist layer 44 over the first doped region 26; the butt contact photoresist opening 44A and/or the first conductive layer 30B (poly-1) are misaligned and expose the first portion of the shallow trench isolation;

f) See FIG. 2—etching the inter-poly insulating layer 40 through the a butt contact photoresist opening 44A forming a butt contact opening 63 through the interpoly insulating layer 40 and etching the first portion of the shallow trench isolation forming an isolation hole 20A; the isolation hole 20A having sidewalls;

g) See FIG. 3—forming a protective layer 50 over the inter-poly insulating layer 40;

h) See FIG. 4—anisotropically etching the protective layer 50 thereby forming protective spacers 50A on the sidewalls of the isolation hole (e.g., on the sidewalls of the inter poly layer 36, st conductive line 30B, trench isolation region 20 and substrate 10);

i) See FIG. 5—forming a second conductive layer 60 over an inter-poly insulating layer 40, in the butt contact opening 63, and over the protective spacers 50A whereby the protective spacers 50A preventing the second conductive layer 60 from contacting the substrate;

j) See FIG. 6—forming a planarizing layer 66 over resulting surface;

k) forming metal layers 68 and passivation layers over the planarizing layer 66 to form a conductor device.

The butt contact structure of the invention can be summarized as follows:

a) See FIG. 6—an isolation region 20 in an isolation area in a substrate 10; said isolation region 20 defining active areas 14 in said substrate 10; a first portion of said isolation region having an isolation hole; said isolation hole having sidewalls;

b) a first conductive line 30B over portions of said shallow trench isolation region 20 and said active region 14;

c) an inter-poly insulating layer 40 over said first conductive line; 30B 34 d) a butt contact opening 63 through said inter-poly insulating layer 40 exposing said active region and said first portion of said isolation region;

e) protective spacers 50A over at least the sidewalls of said isolation hole;

f) a second conductive layer 60 over said inter-poly insulating layer 40, in said butt contact opening contacting said active area, and over the protective spacers 50A whereby said protective spacers 50A prevent said second conductive layer 60 from contacting said substrate in said isolation area.

The invention forms a butt contact structure having protective spacers 50A that prevent the second conductive layer (poly-2) 60 from, electrically shorting to the substrate 10. The invention prevents the mis-alignment of the poly1 gate 30A and first conductive layer 30B with the shallow trench isolation (STI) region from causing shorts between the second conduction layer 60 and the substrate (e.g., p-well) 10. Also, the protective spacers of the invention allow the design rules to be extended to the limit (e.g., 0). The extension rule of the active region 14 to the Butt contact opening 63 or from the active region 14 to the first conductive layer (poly-1) 30B can be reduced to zero as show in FIG. 10A (extensions 70 and 70 required without the spacers 50A) and FIG. 10B (zero extension needed with invention's spacers 50A).

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming Integrated Butt Contact having a protective Spacer 50A to protect against mis-alignment.

Figure 9A:
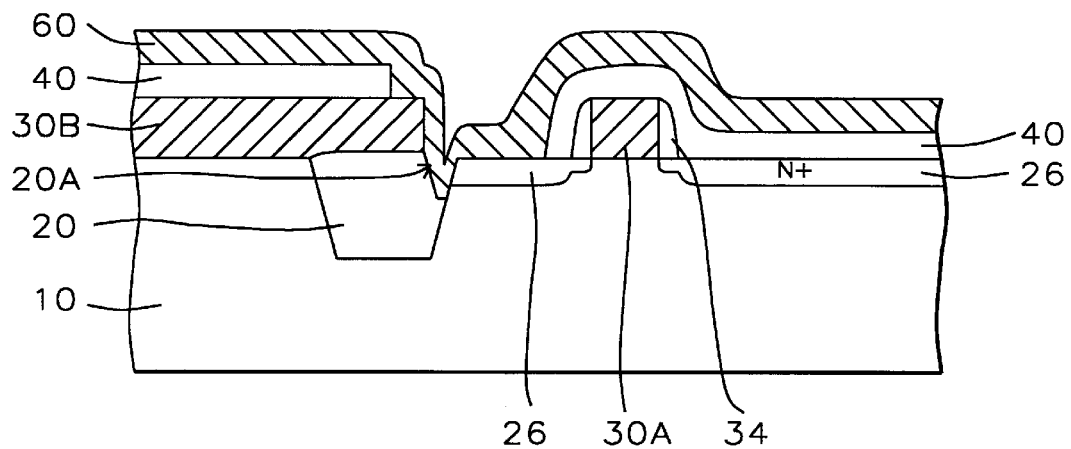
FIG. 9A is a cross sectional view showing the inventor's previous butting contact structure which allows shorting between the poly-2 layer 60 and the substrate when the poly-1 layer is mis-aligned.

The inventor discovered that a major problem with butt contact structures is photo mis-alignment that creates shorts between the poly-2 layer and the substrate. This problem is explained below. The inventor uses a butt contact structure 61 shown in FIG. 9A. FIG. 9A is a cross sectional view of a substrate 10, isolation region 20, doped regions 26, an inter polysilicon dielectric (IPD) layer 40, gate electrodes 30A, first conductive line (Poly-1) 30B and second conductive line (poly-2) 60. The butt contact is intended to connect between the doped region 26, the poly-1 layer 30B and the poly-2 layer 60. FIG. 9A shows the situation where a photo misalignment causes the poly-1 layer 30b and therefore the butt contact to be mis-aligned. The front edge of the poly-1 layer 30B should be even with the edge of the doped region 26. The misaligned poly-1 layer 30B exposes a portion of the isolation region 20. When the butt contact opening is defined by an etch, the exposed portion of the isolation region 20 is etched thus forming an isolation hole 20A. The isolation hole 20a can expose a portion of substrate 10 below the doped region 20. Next, the poly-2 layer 60 is formed over the inter poly dielectric layer (IPO) layer 40, the doped region 26, in the butting contact opening 40A and filling the isolation hole 20A. This forms a short in the hole 20A from the poly-2 layer 60 to the substrate 10 and causes device failure.

The invention provides a structure and method to overcome this misalignment and shorting problem.

Figure 1:
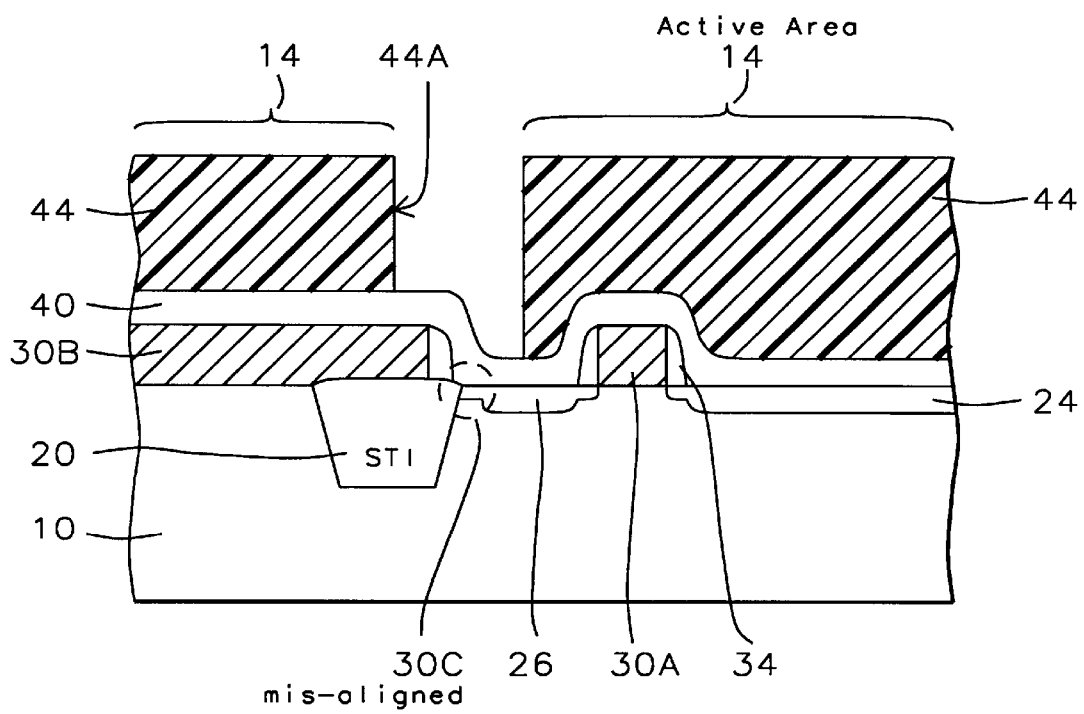
FIGS. 1 through 6 are cross sectional views for illustrating a method for manufacturing a butting contact present invention.
Figure 2:
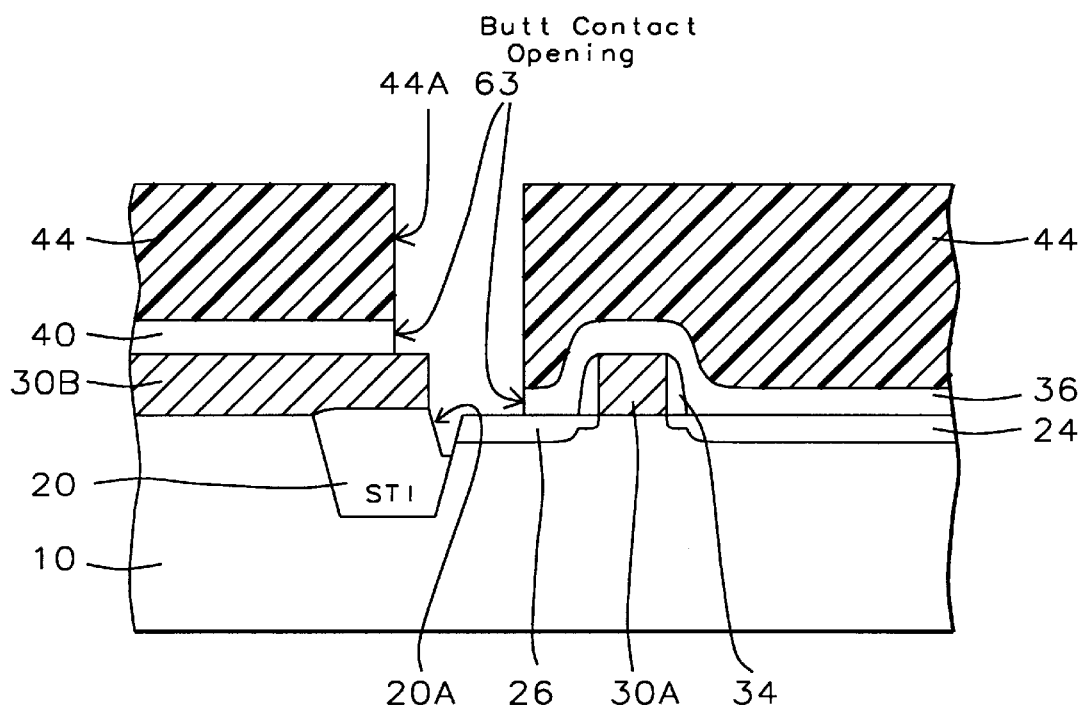
Figure 3:
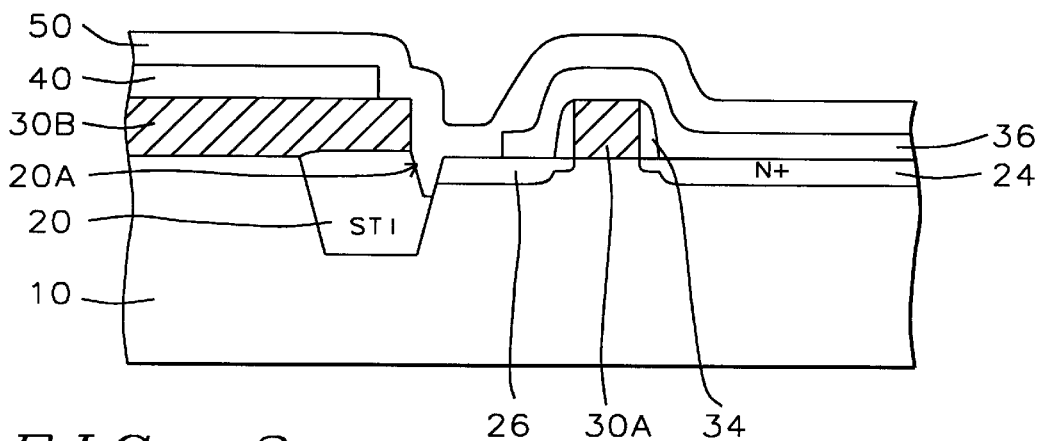
Figure 4:
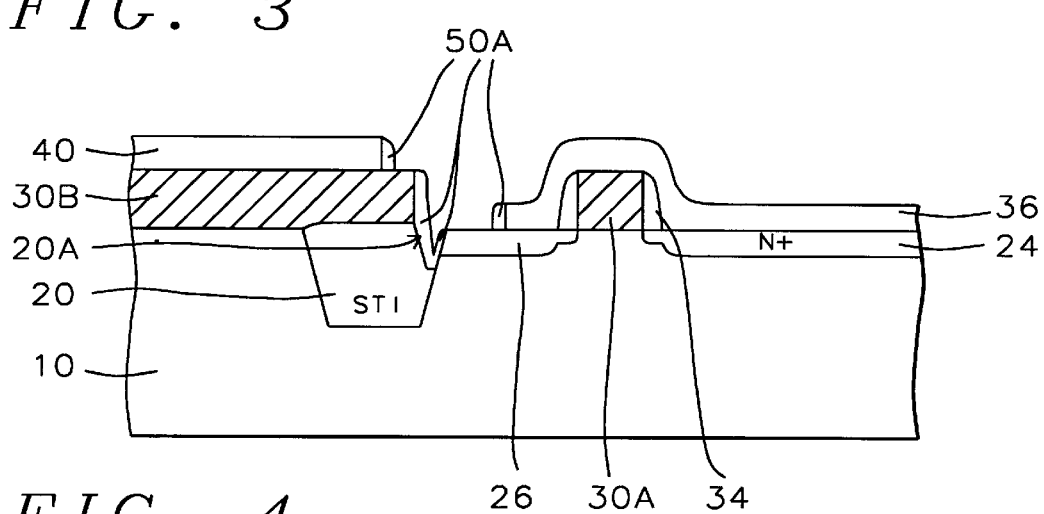
Figure 5:
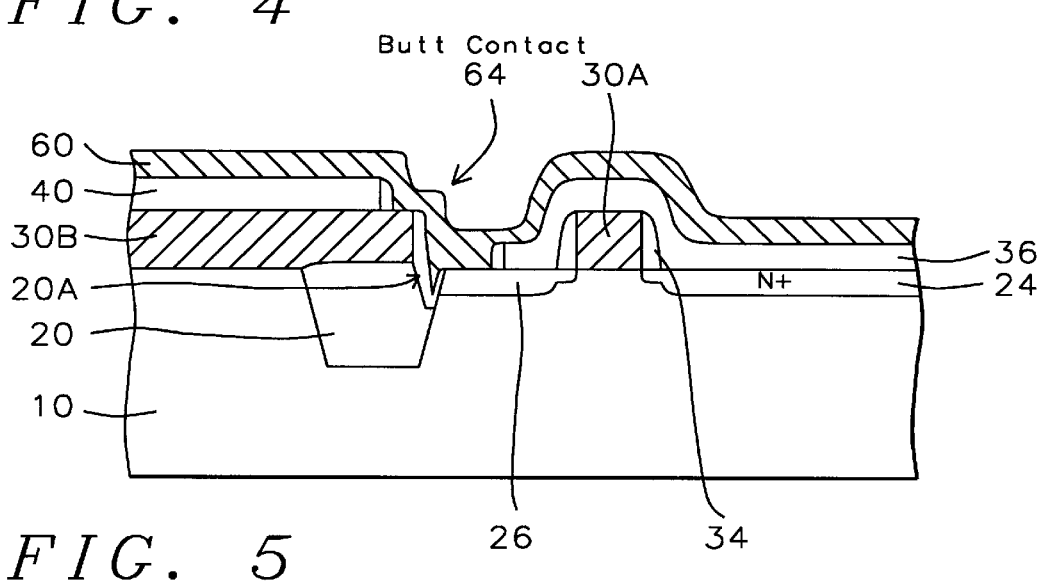
Figure 6:
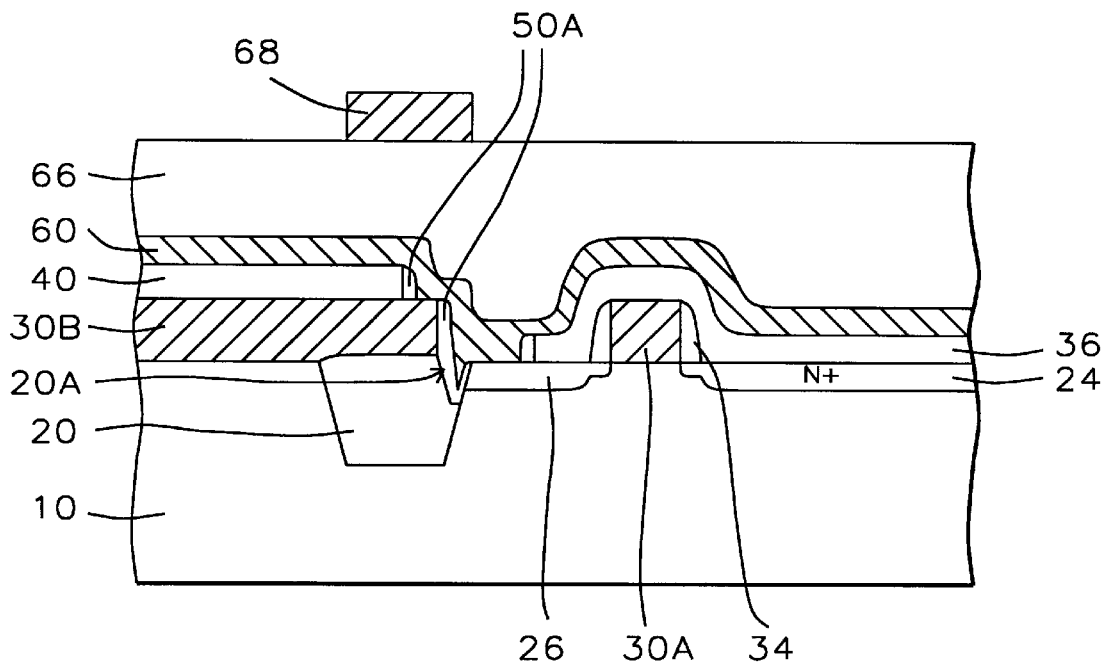

An overview of the major process steps in forming the butt contact of the present invention is shown below:

1. FIG. 1—define active regions 14
2. form shallow trench isolation 20—FIG. 1
3. deposit gate material 30A 30B—FIG. 1
4. define gate areas—Poly 1 layer 30B shown misaligned in FIG. 1
5. S/D engineering (N-LDD, P-LDD , N+ AND P+)—FIG. 1
6. inter-poly oxide layer 40 deposition (LPTEOS or PETEOS 1000A–2000A)
7. Butt-contact photo 44 FIG. 1
8. FIG. 2—inter-poly oxide etch (5000 A)
9. FIG. 3—deposit Si3N4 protective layer 50 (300 to 1500 Å)
10. FIG. 4—Si3N4 protective layer 50 etch back to form a Si3N4 spacer 50A
11. FIG. 5—poly-2 layer 60 deposition—poly load (e.g., undoped polysilicon 550 Å)
12. FIG. 6—define poly-2 area (include poly-2 photo & etch)
13. define poly-2 local interconnect implant (VCC regions & Butt-contacts)
14. BPTEOS deposition 64 (undoped PETEOS (I–2 kA)+ BPTEOS(3–12 kA))
15. BPTEOS flow (750 C–900 C)
16. define contact Metal-1 68, via, Metal-2 and passivation areas (include sputter, photo and etch) and complete the semiconductor device FIGS. 1 through 6 show the stops to form the butt contact of the present invention. As shown in FIG. 1, a shallow trench isolation region 20 is formed in a substrate 10. FIG. 10C shows a top down view of the butt contact being fabricated in FIGS. 1 through 6. FIG. 10c shows the butt contact at the stage shown in FIG. 2.

The isolation region 20 defines active areas 14 in the substrate 10. Active areas are non-isolation areas where devices will be formed. Also, the isolation regions are formed over isolation areas in the substrate. It will be appreciated that a plurality of active areas 14 and shallow trench isolation (STI) regions are formed in the substrate 10. The substrate is understood to possibly include a semiconductor wafer, active and passive devices formed within the wafer such as p-wells (not shown).

Next, gate structure 30A 30B are formed over the substrate surface. The gate electrode structure 30A and the first conductive Lines 30B are preferably formed from a first poly silicon layer (e.g., poly-1 layer) that is patterned. The blanket polysilicon layer (poly-1) is formed over the substrate surface and .s patterned to form the gate structures and conductive lines over the shallow trench isolation (STI) regions and active regions. The gate structures include at least a first conductive layer 30A over portions of the active area 14. The gate structures can have sidewall spacers 34, a bottom gate oxide and a top gate insulating layer (not shown) (over the poly-1 layer) as is well known to those skilled in the art.

In addition, a first conductive line 30B is formed over portions of the shallow trench isolation region 20 and the active region 14. The first conductive line 30B can be misaligned as shown in area 30C in FIG. 1. The misaligned first conductive line 30B exposes portions of the shallow trench isolation region 20.

The first conductive layer 30B and the gate electrodes 30A are preferably comprised of a doped polysilicon layer and a tungsten silicide (WSi$_x$)layer having a thickness in a range of between about 1500 and 3500 Å.

Still referring to FIG. 1, first and second doped regions 24, 26 (source and drain regions) are formed adjacent to thee gate structure 30A in the active areas 14. The first doped region 26 is positioned between the gate structure 30A and the shallow trench isolation region 20.

In addition, in the case of fabricating a 4T SRAM, Vcc doped regions (not shown, but see FIG. 9B) in the substrate 10 can be made by using a conventional photo and ion implant process. Preferably As or P$_{31}$ ions are implant at a dose in a range of between about 1E15 and 4E15 atoms/cm$^2$ and at an energy between 30 and 60 Kev.

An inter-poly insulating layer 40 is formed over the gate structure and the first conductive line 30B 34. The inter-poly insulating layer 40 is preferably formed by a process of LPTEOS (low pressure TetraEthylOrthoSilicate (TEOS) oxide) or PETEOS (plasma enhanced TetraEthylOrthoSilicate (TEOS)). The inter-poly dielectric insulating layer (IPO) 40 preferably has a thickness between about 1000 and 2000 Å.

Still referring to FIG. 1, a first photoresist layer (e.g., butt contact photoresist layer) 44 is formed having a butt contact photoresist opening 44A through the first photoresist layer 44 over the first doped region 26. When the first poly layer 30B is properly aligned, the first poly layer 30B covers the shallow trench isolation (STI) region 20. FIG. 1, shows the first polysilicon layer 30B misaligned. The butt contact photoresist opening 44A exposes a first portion of the shallow trench isolation as shown in FIG. 1.

As shown in FIG. 2, the inter-poly insulating layer 40 is etched through the butt contact photoresist opening 44A forming a butt contact opening 63 through the inter-poly insulating layer 40, first conductive layer 30B and the sidewall spacers. The etch continues by etching the first portion of the shallow trench isolation forming an isolation hole 20A. The isolation hole 20A has sidewalls. The oxide etch preferably removes between about 4000 and 6000 Å of oxide and more preferably removes about 5000 Å. It should be noted that the isolation hole 20A can expose a portion of the substrate (or p-well) 10 under the doped regions (S/D regions) 26. If the second polysilicon layer 60 contacts the substrate (or p-well) 10 then the device will fail.

In an important step protective spacers 50A are formed on the sidewalls of the isolation hole 20A. As shown in FIG. 3, a protective layer 50 is formed over the resultant surface including the sidewalls of the Isolation hole 20A formed by the photo mis-alignment.

As shown in FIG. 4, protective spacers 50A are formed on the sidewalls of the isolation hole 20A and the butt contact hole 03 (e.g., sidewalls of the inter poly layer 40, first conductive layer 300, trench isolation 20) preferably by anisotropically etching the protective layer 50. The protective spacers 50A are preferably composed of silicon nitride, Silicon oxynitride, or silicon oxide, and are most preferably composed of silicon nitride. The protective spacers preferably have a thickness in a range of between about 200 and 1000 Å and more preferably a thickness in a range of between about 150 and 550 Å and more preferably about 500 Å. The thickness of the spacers can be adjusted to the size of the contact holes and isolation holes as the contact opening changes with technological advances.

As shown in FIG. 5, a second conductive layer 60 (i.e., a poly 2 layer) is formed over an inter-poly insulating layer 40, in the butt contact opening 63, in the isolation hole 20A, over the first conductive lines 30B and over the protective spacers 50A. The protective spacers 50, prevent the second conductive layer 60 from contacting the substrate (p-well) 10.

The second conductive layer 60, when used as a load resistor, is preferably formed by depositing a blanket undoped polysilicon layer over the substrate surface. The second conductive layer can be formed by other processes as know in the art. The second conductive layer is then pattering to elements, such as in the case of 4T SRAM fabrication, contacts to Vcc regions and Butt contacts. The second conductive layer 60 preferably has a thickness in a range of between about 500 and 600 Å and more preferably about 550 Å.

As shown in FIG. 6, dielectric layers and metal layers are formed over the resultant surface to connect up device elements and to form a semiconductor device. For example FIG. 6, shows a planarizing layer 66 formed over the resulting surface. The planarizing layer 66 is preferably composed of two layers: (1) a undoped PETOS layer having a thickness in a range of between about 1000 and 2500 Å and (2) a BPTEOS layer having a thickness in a range of between about 3000 and 12,000 Å. Preferably the BPTEOS (borophosphosilicate TetraEthylOrthoSilicate (TEOS)) is flowed at a temp between about 750 and 900° C. Next, conductive metal layers 68 are formed to connect up the elements (e.g., define contact metal-1, via, metal-2, passivation areas (including sputter and photo and etch).

This invention is applicable to many semiconductor devices where a conductive (e.g., a second poly) layer is made to contact with the substrate and there is the possibility of shorting to the substrate through a hole in the isolation region. In particular, the invention is applicable to SRAM devices having shallow trench isolation (STI) regions.

Figure 7:
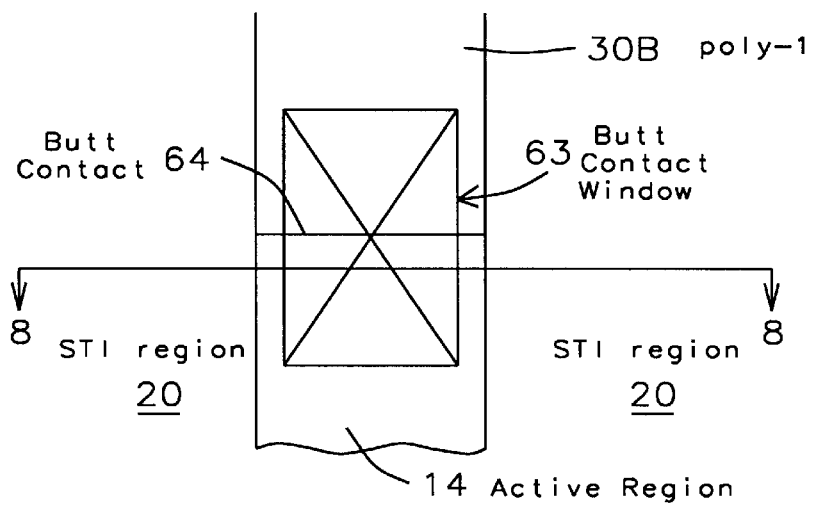
FIG. 7 is a top down view of the butting contact structure according to the present invention.

FIG. 7 shows a top down view of the butting contact 64 of the present invention when the poly1 layer 30B is proper-y aligned to the isolation region 20.

Figure 8:
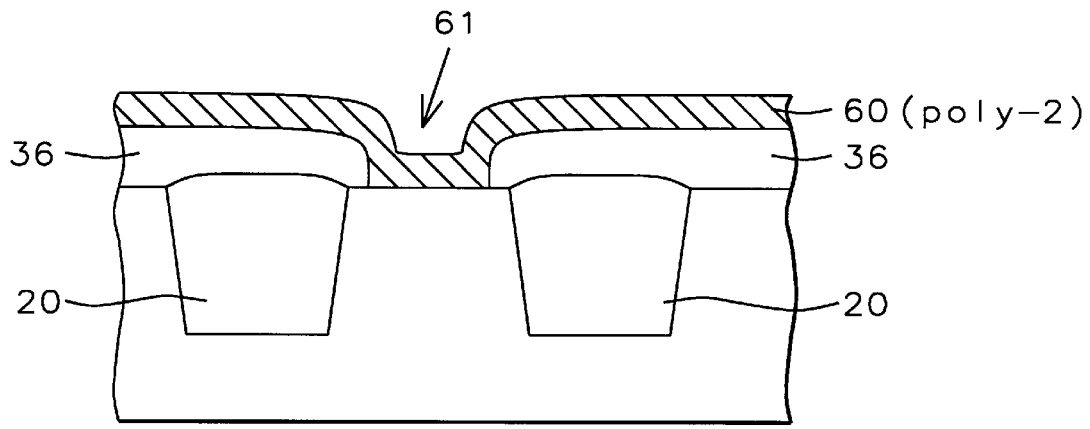
FIG. 8 is a cross sectional view taken along line 8' in FIG. 7, for illustrating a method forming a butting contact structure according to the present invention.

FIG. 8 is a cross sectional view taken along axis 7 in FIG. 8.

Figure 9B:
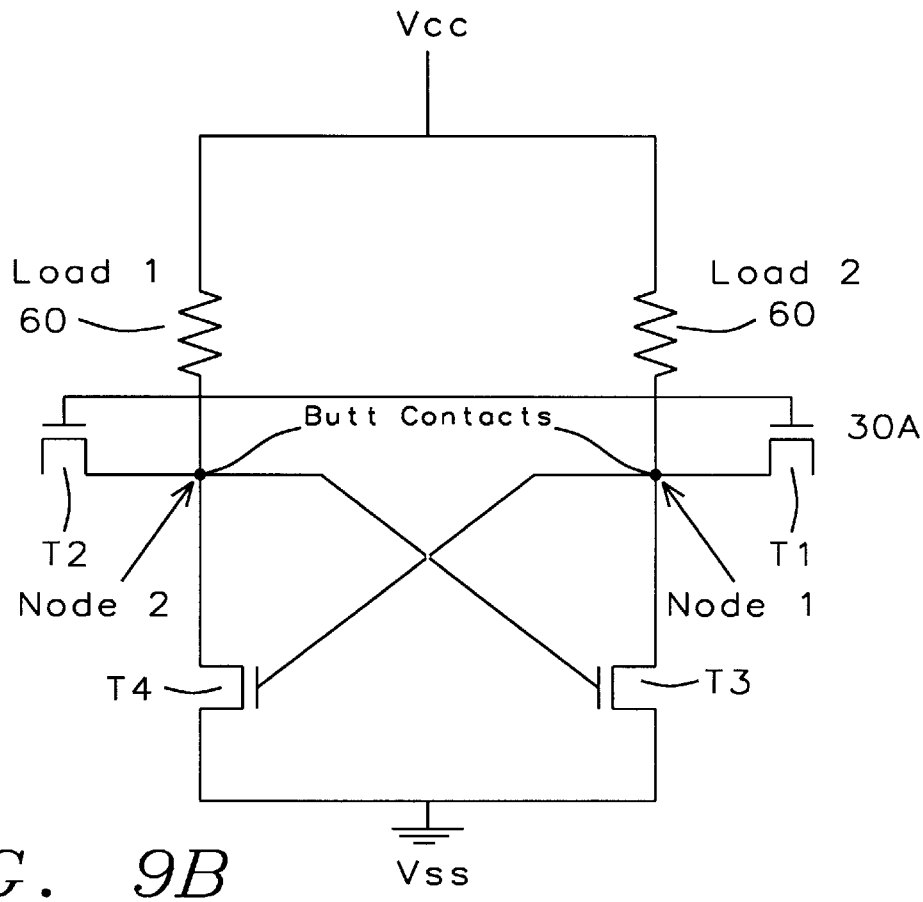
FIG. 9B is a schematic view of a 4T SRAM with load resistors 60 that can be used to implement the butt contact 64 of the present invention.

FIG. 9B shows a schematic diagram of a 4T 2 Load SRAM (two poly layers ) that the inventor has implemented butt contacts 60A between the nodes 1 and 2 and the gates of transistors T3 and T4. The transistors T1 T2 T3 and T4 are preferably NMOS transistors. The gates of the transistors are formed from the poly 1 layer 30B. The load 1 and 2 resistors are formed from the poly 2 player 60.

Figure 9C:
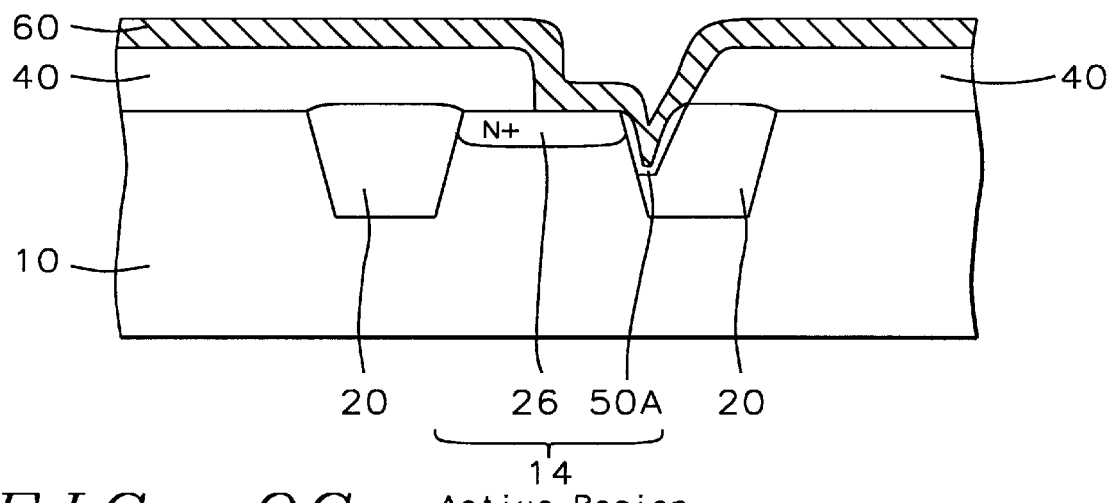
FIG. 9C is a cross sectional view along axis 9C in FIG. 9D of the butting contact structure of the invention where the protective spacers 50A prevent shorting between the poly-2 layer and the p-well when the poly-1 layer is misaligned.
Figure 9D:
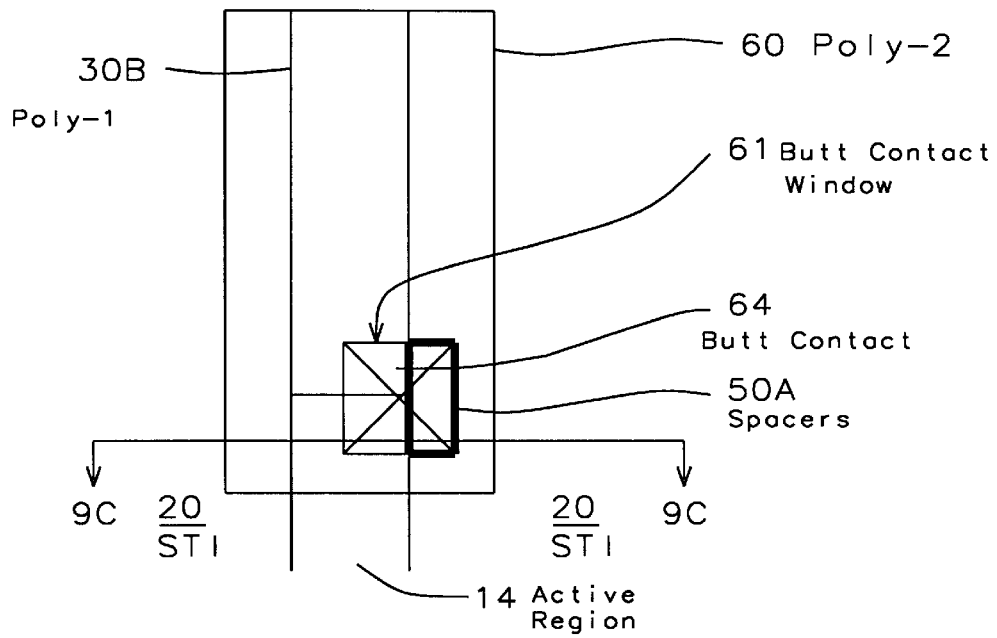
FIG. 9D is a top down view of a butt contact that is mis-aligned according to the present invention. Butt contact window 61 is misaligned and exposes the isolation region 20 where the protective spacers 50A of the invention are formed.

FIG. 9C shows a cross sectional view along axis 9c in top down view FIG. 9D. FIG. 9C shows the spacers 50A of the invention preventing the shorting between the poly-2 layer 60 and the p-well 10 (substrate).

FIG. 9D shows a top down view of the butt contact of the invention with the butt contact 64 to active area 14/poly 1 layer 30B mis-aligned. FIG. 9C shows a cross sectional view through axis 9C in FIG. 9D. FIG. 9C shows how the spacers 50A prevent shorting to the substrate ill the isolation area in the butt contact 64.

Figures 10A, 10B:
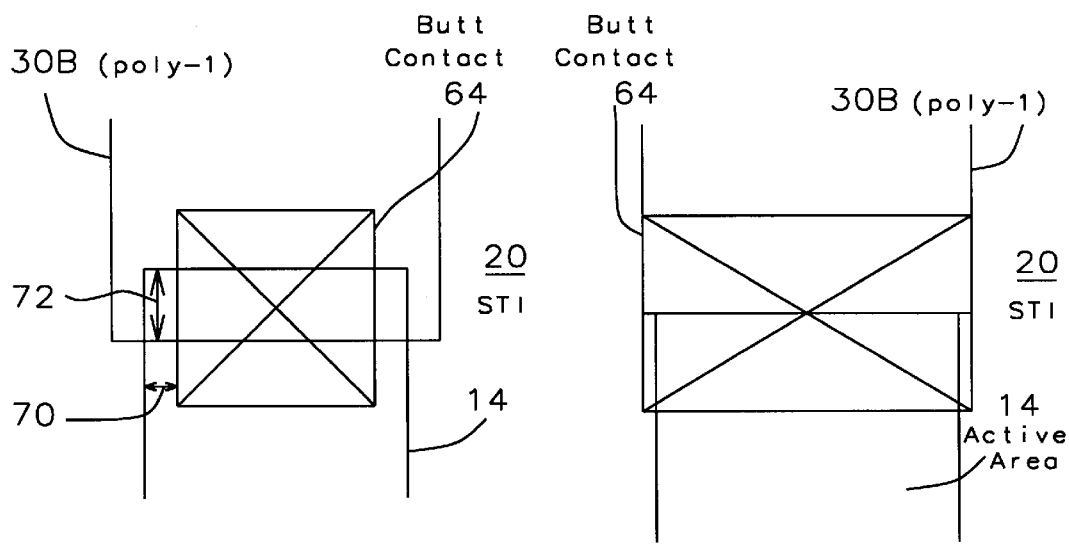
FIG. 10A is a top down view of a butt contact formed with extension rules 70, 72 (overlap between the poly 1 layer 30B and the active area 14) which reduce the butt contact shorting to the active area 14.
FIG. 10B is a top down view of a butt contact of the invention formed with the design extension rules pushed to the limit showing the butt contact 64 extending from the edges of the active regions and having no over lap between the poly 1 30B and the active region 14.
Figure 10C:
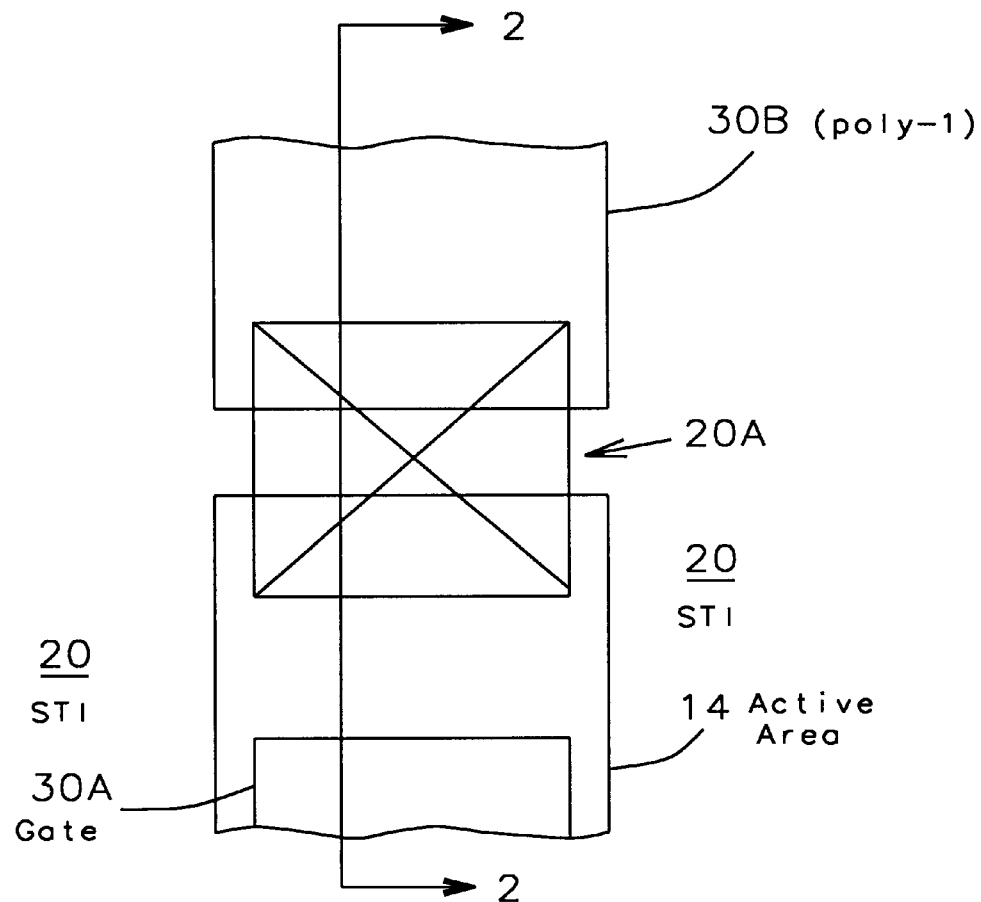
FIG. 10C is a top down view of FIG. 2.

FIG. 10A is a top down view of a butt contact formed with extension rules 70, 72 (overlap between the poly 1 layer 30B and the active area 14) which reduce the butt contact shorting to the active area 14.

FIG. 10B is a top down view of a butt contact of the invention formed with the design extension rules pushed to the limit showing the butt contact 64 extending from the edges of the active regions and having no over lap between the poly 1 30B and the active region 14.

FIG. 10C is a top down view of a butt contact of the invention formed with a poly-1 photo misalignment where there is a gap between the active region 14 and the poly 1 layer 30. FIGS. 1 through 6 explain how the invention's spacers 50A prevent shorting in the hole 20A.

The invention forms a butt contact structure having protective spacers 50A that prevent the second conductive layer (poly-2) 60 from electrically shorting to the substrate 10 having a hole 20A in the isolation region 20. The invention prevents the mis-alignment of the poly1 gates 30B and conductive layer 40 with the shallow trench isolation (STI) region 20 from causing a short between the second polysilicon layer 60 and the substrate (e.g. p-well) 10. The protective spacers 50A of the invention allow the design rules to be extended to the limit (e.g., 0). The extension rule of the active region 14 to the Butt contact opening 63 or from the active region 14 to the first conductive layer (poly-1) 30B can be reduced to zero as show in FIGS. 10A (extensions 70 and 70 required without the spacers 50A) and FIG. 10B (zero extension need with invention's spacers S5A).

It should be will understood by one skilled in the art that by including additional process step not described in this embodiment, other types of devices can also be included on the chip (e.g., SRAM). For example, P wells in the P substrate and CMOS circuit can be formed therefrom. it should also be understood that the figures depict only one cell out of a multitude of cells that are fabricated simultaneously on the substrate. Also, the contact structure can be used in other chip types ill addition to SRAM chips.

While the invention has been particularly shown and described will be understood by those skilled in the art that various changes in form and details may be made without departing from the spirit and scope of the invention.

What is claimed is:

1. A butt contact structure having a protective spacer to protect against shorting between a second conductive layer and the substrate in a isolation hole comprising:
   a) an unlined isolation region in an isolation area in a substrate; said isolation region defining active areas in said substrate; a first portion of said isolation region having an isolation hole; said isolation hole and said first portion of said isolation region having sidewalls;
   b) a first conductive line over portions of said isolation region and said active region;
   c) an inter-poly insulating layer over said first conductive line;
   d) a butt contact opening through said inter-poly insulating layer exposing said active region and said first portion of said isolation region;
   e) protective insulative spacers over at least the sidewalls of said isolation hole and the sidewalls of said first portion of said isolation region;
   f) a second conductive layer over said inter-poly insulating layer, in said butt contact opening contacting said active area, and over said protective insulative spacers whereby said protective spacers prevent said second conductive layer from contacting said substrate in said isolation area.

2. The butt contact structure of claim 1 wherein said protective spacers are composed of silicon nitride and having a thickness in a range of between about 300 and 1000 Å.

3. The butt contact structure of claim 1 wherein said first conductive line is comprised of a doped polysilicon layer and an overlying tungsten suicide layer having a combined total thickness in a range of between about 1500 and 3500 Å.

4. The butt contact structure of claim 1 wherein said inter-poly insulating layer composed of a material selected from the group consisting of LPTEOS and PETEOS; and has a thickness between about 1000 and 2000 Å.

5. The butt contact structure of claim 1 wherein said second conductive layer is composed of polysilicon having a thickness in a range of between about 500 and 600 Å.

* * * * *